United States Patent [19]

Ruetz

[11] Patent Number: 5,153,450
[45] Date of Patent: Oct. 6, 1992

[54] PROGRAMMABLE OUTPUT DRIVE CIRCUIT

[75] Inventor: J. Eric Ruetz, San Bruno, Calif.

[73] Assignee: Samsung Semiconductor, Inc., San Jose, Calif.

[21] Appl. No.: 730,370

[22] Filed: Jul. 16, 1991

[51] Int. Cl.$^5$ ................ H03K 17/16; H03K 19/092
[52] U.S. Cl. ................................ 307/443; 307/270; 307/475
[58] Field of Search ............... 307/270, 542, 443, 475

[56] References Cited

U.S. PATENT DOCUMENTS

| | | | |
|---|---|---|---|
| 4,719,369 | 1/1988 | Asano | 307/443 |
| 4,820,942 | 4/1989 | Chan | 307/475 |
| 4,885,485 | 12/1989 | Leake et al. | 307/542 |
| 4,918,339 | 4/1990 | Shigeo et al. | 307/542 |
| 4,961,010 | 10/1990 | Davis | 307/542 |

Primary Examiner—Edward P. Westin
Assistant Examiner—Richard Roseen
Attorney, Agent, or Firm—Townsend and Townsend

[57] ABSTRACT

A programmable output driver circuit is provided having multiple drive capabilities for optimizing noise margins at different frequencies. Several signal paths are designed in parallel, each comprising a driver unit made up of a pull-down and a pull-up transistor. Some of the paths can be disabled by NAND gates slowing down the driver circuit to reduce the attendant noise at lower frequencies. Different types of parallel structures can be designed, allowing for variable rise and fall times of the output signal, as well as skewed duty cycles.

4 Claims, 3 Drawing Sheets

PROGRAMMABLE OUTPUT DRIVE CIRCUIT

BACKGROUND OF THE INVENTION

The present invention relates to a high frequency output driver circuit having a programmable drive capability that does not compromise noise performance of the driver circuit at lower frequencies.

Output drivers integrated as part of a larger circuit often act as a source of noise through power supply coupling. The magnitude of this noise is directly related to a frequency of operation of the driver circuit. To be able to drive capacitive loads at high frequencies, output driver circuit design includes providing an output signal having fast rise and fall times. Achieving fast rise and fall times requires devices with very large channel width to length (W/L) ratios capable of sinking and sourcing large amounts of current. As the rise and fall times of the output waveforms of the output driver become faster, the output driver circuit introduces increasingly higher level harmonics into the circuit through the power supply pins, bond wire and lead frame inductance. For operation at lower frequencies, the output waveform has more time to reach a final value, allowing use of smaller and slower devices handling lower amounts of current. This in turn results in reduced noise levels for the output driver circuit and reduced noise coupling for the larger circuit.

Therefore in applications with wide frequency ranges and high frequency requirements, designers have either compromised the noise performance at lower frequencies to obtain high frequency operation, or compromised the frequency performance at higher frequencies to obtain lower noise levels during the low frequency operation.

SUMMARY OF THE INVENTION

It is an object of the present invention to provide an output driver capable of driving various loads at a wide range of output frequencies without sacrificing either noise margins or rise and fall times of an output waveform.

According to the present invention, there are provided various paths designed in parallel to route the output signal. Each path consists of a driver unit with a specific drive capability. Depending on the frequency of operation, a control signal can selectively disable some of these paths. For high frequency operation, enabling more paths provides additional drive capability and speed. At lower frequencies, where rise and fall times may be longer, disabling all parallel paths reduces the drive capability and speed, thereby reducing the attendant noise coupled to the entire system.

The number and size of these selectable parallel paths can vary depending on the application. Read Only Memories (ROMs), in one preferred embodiment, provide selection control signals to select particular ones of the parallel paths to provide necessary current levels without excessive noise levels. The combination of variable number of paths and ROM programmability allows for a fully customized design.

DESCRIPTION OF THE PREFERRED EMBODIMENT

Figure 1:
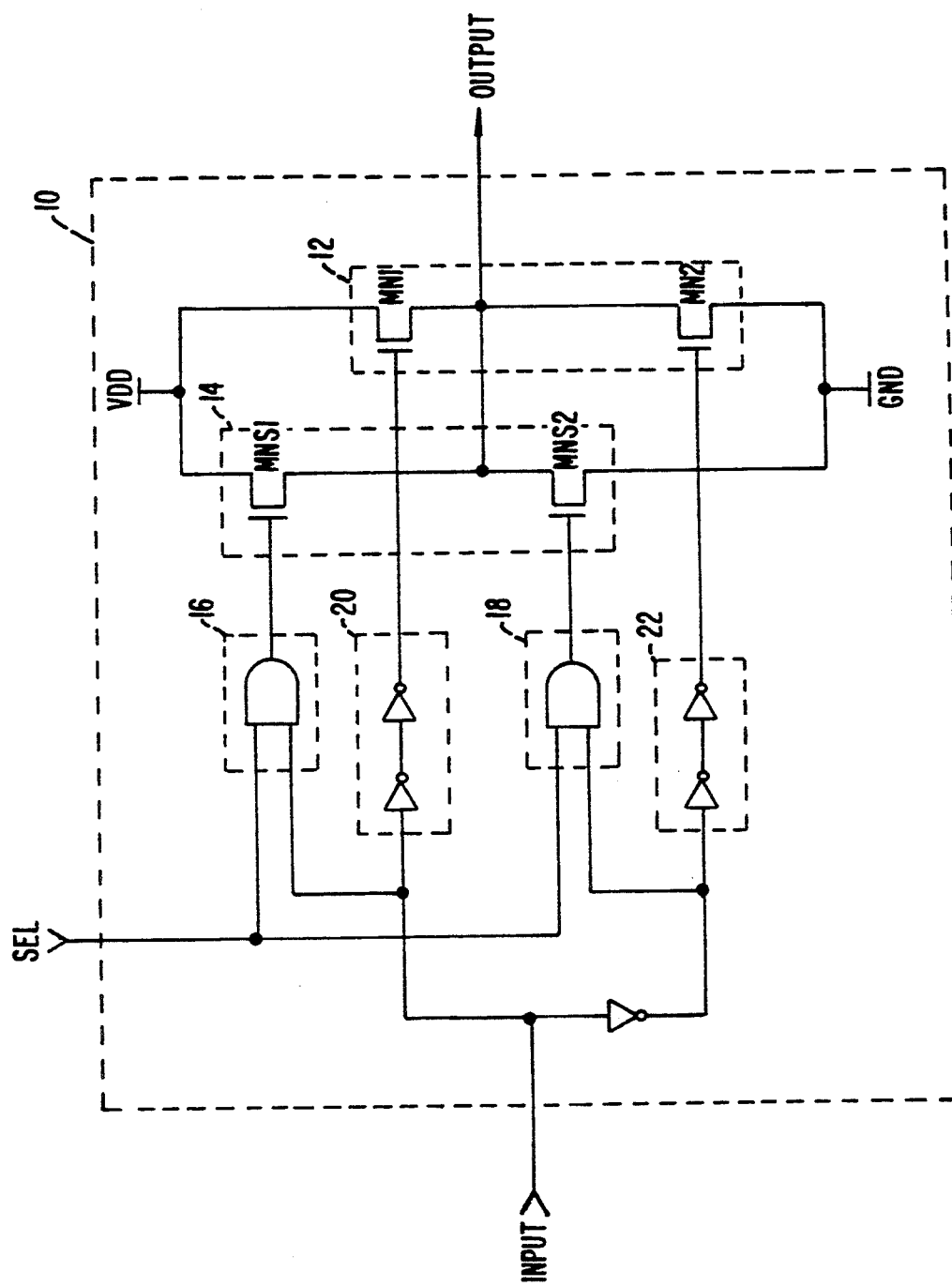
FIG. 1 is a circuit diagram of a programmable output driver with two levels of operation: a default mode, and a high frequency mode.

FIG. 1 is a basic circuit diagram of a programmable output driver 10 in accordance with the subject invention. An input signal is coupled to an input of the driver 10, and is routed to an output through two paths, one of which can be disabled by AND gates 16 and 18. Therefore the output driver 10 provides two levels of drive capability: a default path consisting of driver unit 12, constantly connected for lower frequencies, and a second path consisting of a selectable driver unit 14 placed in parallel with driver unit 12, only upon asserting the SEL input for higher frequency operation.

During default operation the SEL input is low, resulting in a low signal at outputs of both AND gates 16 and 18. This effectively removes N-channel transistors MNS1 and MNS2, the pull-up and pull-down transistors that form the selectable driver unit 14 from the signal path. The remaining pull-up and pull-down N-channel transistors MN1 and MN2 form the default driver unit 12 and are always active. These devices are designed for desired performance at frequencies up to a first particular frequency.

For higher frequency operations, the output signal requires a faster rise and fall time. This faster transition speed is achieved by setting the SEL input to a high level allowing the signal to pass through the AND gates 16 and 18 driving the select transistors MNS1 and MNS2. These select transistors are placed in parallel to the default driver unit 12 transistors resulting in an increased effective size equal to the sum of the two devices. In this case as the sizes of the two devices are equal, the drive capability is doubled. This enables the circuit to drive the same capacitive load at frequencies up to a second particular frequency beyond the first particular frequency. For example, in a preferred embodiment having an output range of about 10 MHz to about 140 MHz, the first particular frequency is in the range of about 60 MHZ to about 80 MHz. The second particular frequency of 140 MHz provides acceptable rise and fall times.

To avoid differing delay times associated with each signal path, delay blocks 20 and 22, comprised of two inverters connected in series, are placed in the default signal path. The input signal is coupled to the input of the driver unit 12 via the delay blocks 20 and 22. The two inverters in each delay block are designed to match the delay introduced in the selectable driver unit 14 path by the AND gates 16 and 18.

Figure 2:
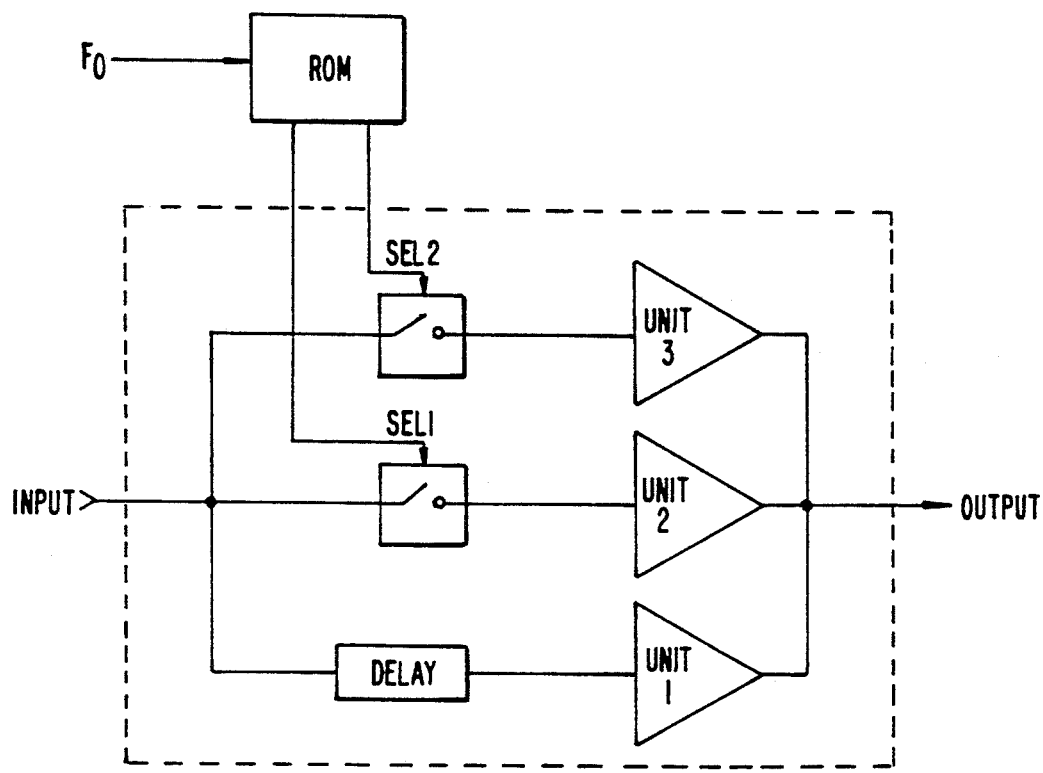
FIG. 2 is a block diagram of a ROM programmable output driver with multiple levels of operation.

FIG. 2 is a block diagram of a ROM programmable output driver with multiple drive capabilities. The ROM stores a program controlling the SEL signals based on the frequency of operation. The designer will calculate desired threshold frequencies at which additional drive is required and enter the values into the program. The user then selects a particular frequency of operation Of, and informs the ROM through an address input. The program is basically in the form of a look-up table and depending on which range of frequencies Of falls in, the proper SEL bit(s) will turn on.

Figure 3:
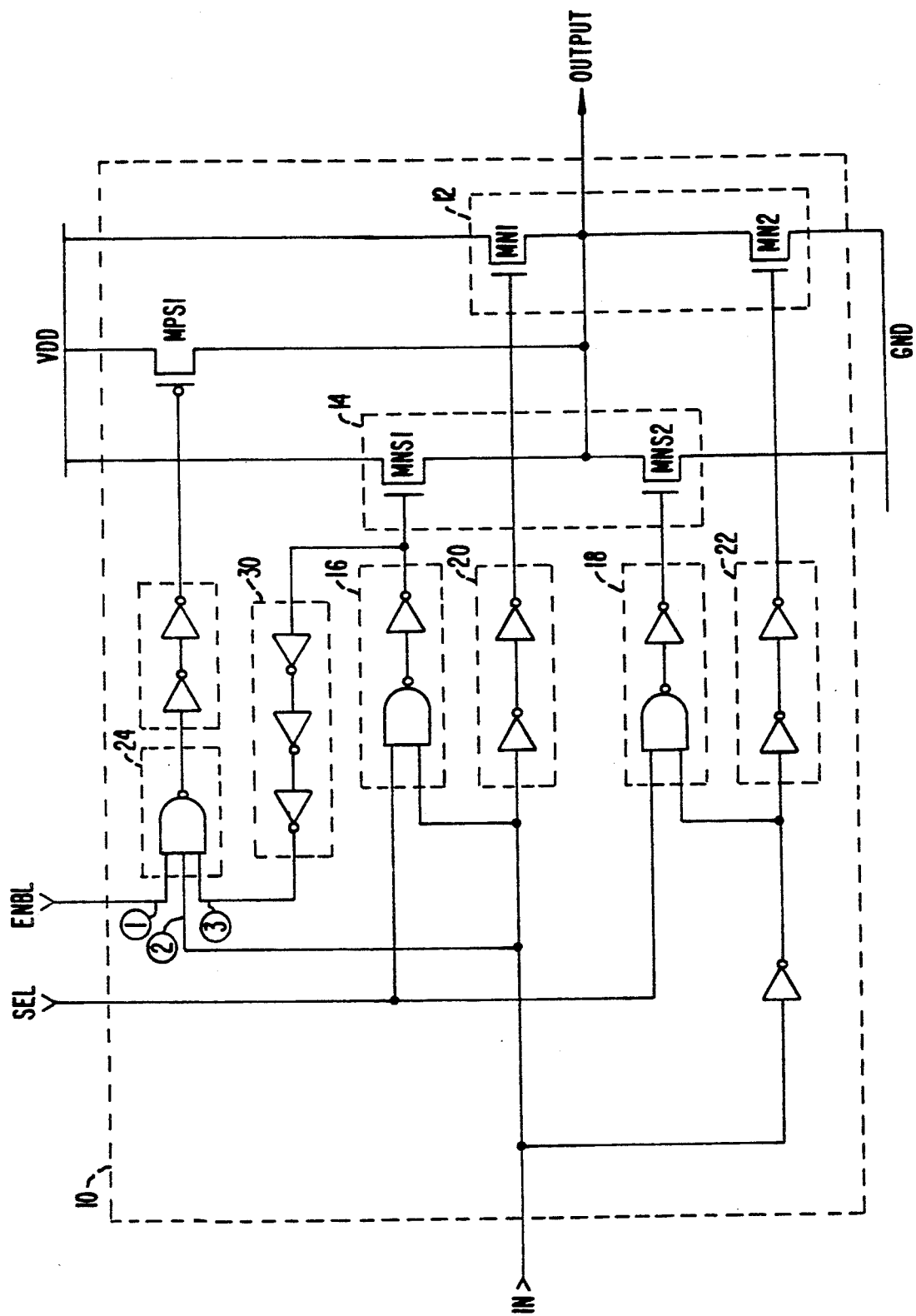
FIG. 3 is a circuit diagram of a two level programmable output driver capable of skewing duty cycle of an output signal to above 50%.

In some applications, skewing of the duty cycle of the output signal may be desirable. FIG. 3 is a circuit diagram of a programmable output driver capable of skewing duty cycle of an output signal to above 50%. A P-channel transistor MPS1 connecting the output of the driver 10 to a supply voltage is turned on by a narrow control pulse generated at each rising edge of the input signal. Thus, only rise times, and not fall times, are affected. Skewing of fall times only could be accomplished by similar modification to the sinking transistor drivers.

Figure 4:
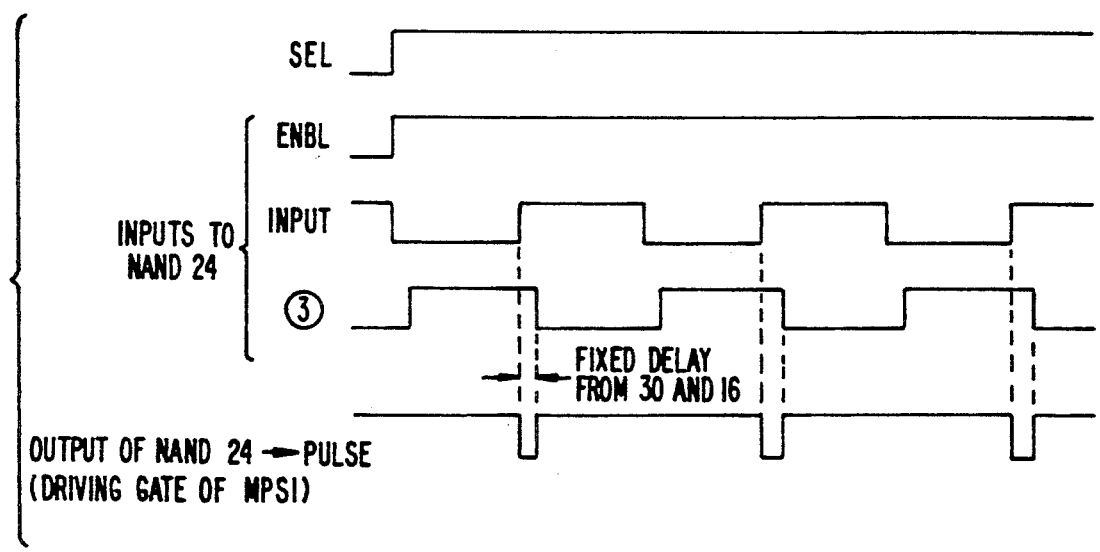
FIG. 4 is a timing diagram illustrating generation of a control pulse for a pull-up transistor required in the skewing circuit.

FIG. 4 is a timing chart illustrating how the control pulse is generated. An output of a 3-input NAND gate 24 is coupled to an input of a delay block 28. The output of delay block 28 drives the gate of MPS1. A first input of NAND 24 is coupled to an enable signal ENBL such that the output of NAND 24 remains high, and therefore MPS1 off, as long as ENBL is held low. A second input of NAND 24 is coupled to the input signal. The output of AND 16 is delayed by a fixed delay block 30 and coupled to a third input of NAND 24. This fixed delay block 30 consists of three inverters connected in series and therefore inverts the signal as well as delaying it by a fixed time delay. Thus, the three inputs to NAND 24 consist of ENBL, the input signal, and the inverted and delayed version of the input signal.

The output of NAND 24 connected as described above, is therefore a negative pulse at each rising edge of the input signal when both SEL and ENBL signals are on. This negative pulse turns on MPS1 for a length of time equal to the fixed delay of block 30 plus the delay introduced by AND 16, at every rising edge of the input signal. With MPS1 turned on, the output of the driver 10 rises faster to supply voltage compared to the normal operation. Since the rise time is decreased while the fall time is unaffected, the resulting output signal would have a duty cycle greater than 50%.

This design offers great flexibility as additional selectable driver units can be added in parallel to further customize the noise-frequency performance. Also, different size pull-up or pull-down transistors can be utilized as described above to skew the duty cycle of the output signal in either direction.

In conclusion, the present invention offers an output driver circuit operating over a wide range of frequencies without adversely affecting noise margins. While the above is a complete description of the preferred embodiments of the present invention, it is possible to use various alternatives, modification and equivalents. For example, instead of N-channel pull-up transistors, P-channel devices can be used enabling the output waveform to swing closer to the supply voltage if desired. Faster fall time during a short period corresponding to the falling edge can be achieved, utilizing a control pulse and an N-channel pull-down device similar to the P-channel version described above for the rising edge. Therefore, the above description does not limit the scope of invention. The appended claims define this scope.

What is claimed is:

1. A programmable output driver circuit, comprising:
   a driver unit, including an input and an output, with said input coupled to an input of the driver circuit, and said output coupled to an output of the driver circuit;
   a selectable driver unit, including an input and an output, with said output coupled to said output of the driver circuit; and
   select means, responsive to a select signal SEL, for coupling said selectable driver unit input to said driver circuit input when said select signal is asserted, for providing additional drive capability in parallel to said first driver unit.

2. A programmable output driver circuit as in claim 1, further comprising:
   delay means, connected between said driver circuit input and said driver unit input, for matching a time delay of said select means.

3. A programmable output driver circuit implemented in metal-oxide-semiconductor technology conducting current from a VDD terminal to a GND terminal, the driver circuit comprising:
   a first two-input AND gate having a first input coupled to a binary select input signal SEL, and a second input coupled to an input of the driver circuit;
   a first delay circuit for matching a time delay of said first two-input AND gate, having an input coupled to said driver circuit input;
   an N-channel pull-down transistor having a drain connected to an output of the driver circuit, a gate coupled to an output of said first delay circuit, and a source coupled to the GND terminal;
   a first selectable N-channel pull-down transistor having a drain connected to said driver circuit output, a gate coupled to an output of said first two-input AND gate, and a source coupled to the GND terminal;
   an inverter having an input coupled to said driver circuit input;
   a second two-input AND gate having a first input coupled to said input signal SEL, and a second input coupled to an output of said inverter;
   a second delay circuit for matching a time delay of said second two-input AND gate, having an input coupled to said inverter output;
   an N-channel pull-up transistor having a drain coupled to the VDD terminal, a gate coupled to an output of said second delay circuit, and a source coupled to said driver circuit output; and
   a first selectable N-channel pull-up transistor having a drain coupled to said VDD terminal, a gate coupled to an output of said second two-input AND gate, and a source coupled to the said driver circuit output.

4. A method for providing a programmable output driver circuit with multiple drive capability for optimising noise margins at various frequencies, comprising the steps of:
   driving an output of the driver circuit, in response to an input signal, using a first set of pull-up and pull-down transistors;
   coupling a set of selectable pull-up and pull-down transistors to said driver circuit output in parallel to said first set of transistors, in response to an assertion of an enable signal; and
   enabling said set of selectable transistors by asserting said enable signal if a frequency of said input signal is above a particular frequency.

* * * * *

UNITED STATES PATENT AND TRADEMARK OFFICE
CERTIFICATE OF CORRECTION

PATENT NO. : 5,153,450
DATED : Oct. 6, 1992
INVENTOR(S) : J. Eric Ruetz It is certified that error appears in the above-identified patent and that said Letters Patent is hereby corrected as shown below:

In column 2, line 67, delete "Of" and substitute therefor, --Fo--.

In column 3, line 1, delete "Of" and substitute therefor, --Fo--.

Signed and Sealed this

Twenty-eighth Day of September, 1993

*Attest:*

BRUCE LEHMAN

*Attesting Officer*     *Commissioner of Patents and Trademarks*